US011015382B2

(12) United States Patent
Yamamoto et al.

(10) Patent No.: US 11,015,382 B2
(45) Date of Patent: May 25, 2021

(54) MOTOR DRIVING DEVICE PROVIDED WITH FAN UNIT

(71) Applicant: FANUC CORPORATION, Yamanashi (JP)

(72) Inventors: Kazuhiro Yamamoto, Yamanashi (JP); Makoto Takeshita, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 78 days.

(21) Appl. No.: 16/174,708

(22) Filed: Oct. 30, 2018

(65) Prior Publication Data
US 2019/0128051 A1   May 2, 2019

(30) Foreign Application Priority Data

Nov. 1, 2017  (JP) .............................. JP2017-212049

(51) Int. Cl.
*E06B 3/52* (2006.01)
*E06B 5/00* (2006.01)
*H05K 7/14* (2006.01)

(52) U.S. Cl.
CPC .................. *E06B 3/52* (2013.01); *E06B 5/00* (2013.01); *H05K 7/1432* (2013.01)

(58) Field of Classification Search
CPC ............ E06B 3/52; E06B 5/00; H05K 7/1432
USPC ........ 49/254, 257, 258, 260, 50, 56, 57, 209
See application file for complete search history.

(56) References Cited

U.S. PATENT DOCUMENTS

| | | | | |
|---|---|---|---|---|
| 2,714,359 A | * | 8/1955 | Seaver | F23M 7/00 110/176 |
| 4,262,447 A | * | 4/1981 | Schneier | E05C 19/006 422/118 |
| 4,993,187 A | * | 2/1991 | Schweiss | E05C 19/006 49/257 |
| 5,185,955 A | * | 2/1993 | Pedersen | E05D 15/18 49/183 |
| 6,018,911 A | * | 2/2000 | Menegazzo | E05D 3/18 49/213 |

(Continued)

FOREIGN PATENT DOCUMENTS

| | | |
|---|---|---|
| CN | 101331815 A | 12/2008 |
| CN | 102270901 A | 12/2011 |

(Continued)

OTHER PUBLICATIONS

English Abstract and Machine Translation for Japanese Publication No. 2009-027776 A, published Feb. 5, 2009, 10 pgs.
English Abstract and Machine Translation for Japanese Publication No. 2005-346033 A, published Dec. 15, 2005, 26 pgs.
English Abstract and Machine Translation for Japanese Publication No. 2007-165723 A, published Jun. 28, 2007, 34 pgs.

(Continued)

*Primary Examiner* — Gregory J Strimbu
(74) *Attorney, Agent, or Firm* — Fredrikson & Byron, P.A.

(57) ABSTRACT

A motor driving device includes a mounting member including a mounting hole; a fan unit configured to be fixed to the mounting member, the fan unit including a lid disposed to cover the mounting hole; a restricting member configured to restrict movement of the lid by sandwiching the lid between the restricting member and the mounting member; and a guide mechanism configured to guide an operation of the restricting member moving relative to the lid from a non-restricting position where movement of the lid is allowed to a restricting position where movement of the lid is restricted.

5 Claims, 12 Drawing Sheets

(56) References Cited

U.S. PATENT DOCUMENTS

| | | | | |
|---|---|---|---|---|
| 8,484,898 | B2* | 7/2013 | Ohishi | E05D 3/022 49/213 |
| 9,378,995 | B2* | 6/2016 | Bonora | H01L 21/67772 |
| 2010/0117377 | A1* | 5/2010 | Okabe | E05B 17/0029 292/159 |

FOREIGN PATENT DOCUMENTS

| | | |
|---|---|---|
| CN | 202190479 U | 4/2012 |
| JP | 2004265789 A | 9/2004 |
| JP | 2005346033 A | 12/2005 |
| JP | 200773448 A | 3/2007 |
| JP | 2007165723 A | 6/2007 |
| JP | 200927776 A | 2/2009 |
| JP | 201159236 A | 3/2011 |

OTHER PUBLICATIONS

English Abstract and Machine Translation for Japanese Publication No. 2004-265789 A, published Sep. 24, 2004, 17 pgs.
English Abstract and Machine Translation for Japanese Publication No. 2007-073448 A, published Mar. 22, 2007, 42 pgs.
English Abstract and Machine Translation for Japanese Publication No. 2011-059236 A, published Mar. 24, 2011, 25 pgs.
English Abstract and Machine Translation for Chinese Publication No. CN 101331815 A, published Dec. 24, 2008, 14 pgs.
English Abstract and Machine Translation for Chinese Publication No. CN 102270901 A, published Dec. 7, 2011, 6 pgs.
English Abstract and Machine Translation for Chinese Publication No. CN 202190479 U, published Apr. 11, 2012, 6 pgs.

\* cited by examiner

MOTOR DRIVING DEVICE PROVIDED WITH FAN UNIT

BACKGROUND OF THE INVENTION

1. Field of the Invention

The present invention relates to a motor driving device including a fan unit.

2. Description of the Related Art

A motor driving device including a mounting member provided on a high-voltage cabinet and a fan unit fixed to the mounting member is known (e.g., JP 2009-027776 A).

In the related art, there is a demand for a technology that makes it easier to install a fan unit on a mounting member.

SUMMARY OF THE INVENTION

In an aspect of the present disclosure, a motor driving device includes a mounting member formed with a mounting hole; a fan unit fixed to the mounting member and including a lid disposed to face the mounting member so as to cover at least a part of the mounting hole; a restricting member configured to restrict movement of the lid in a direction away from the mounting member by holding the lid between the restricting member and the mounting member; and a guide mechanism configured to guide movement of the restricting member along the lid from a non-restricting position where the movement of the lid in the direction is allowed to a restricting position where the movement of the lid in the direction is restricted.

According to the present disclosure, because the lid can be fixed to the mounting member by the restricting member without using a fastener such as bolt, it is possible to facilitate to attach the fan unit to the mounting member.

DETAILED DESCRIPTION

Figure 1:
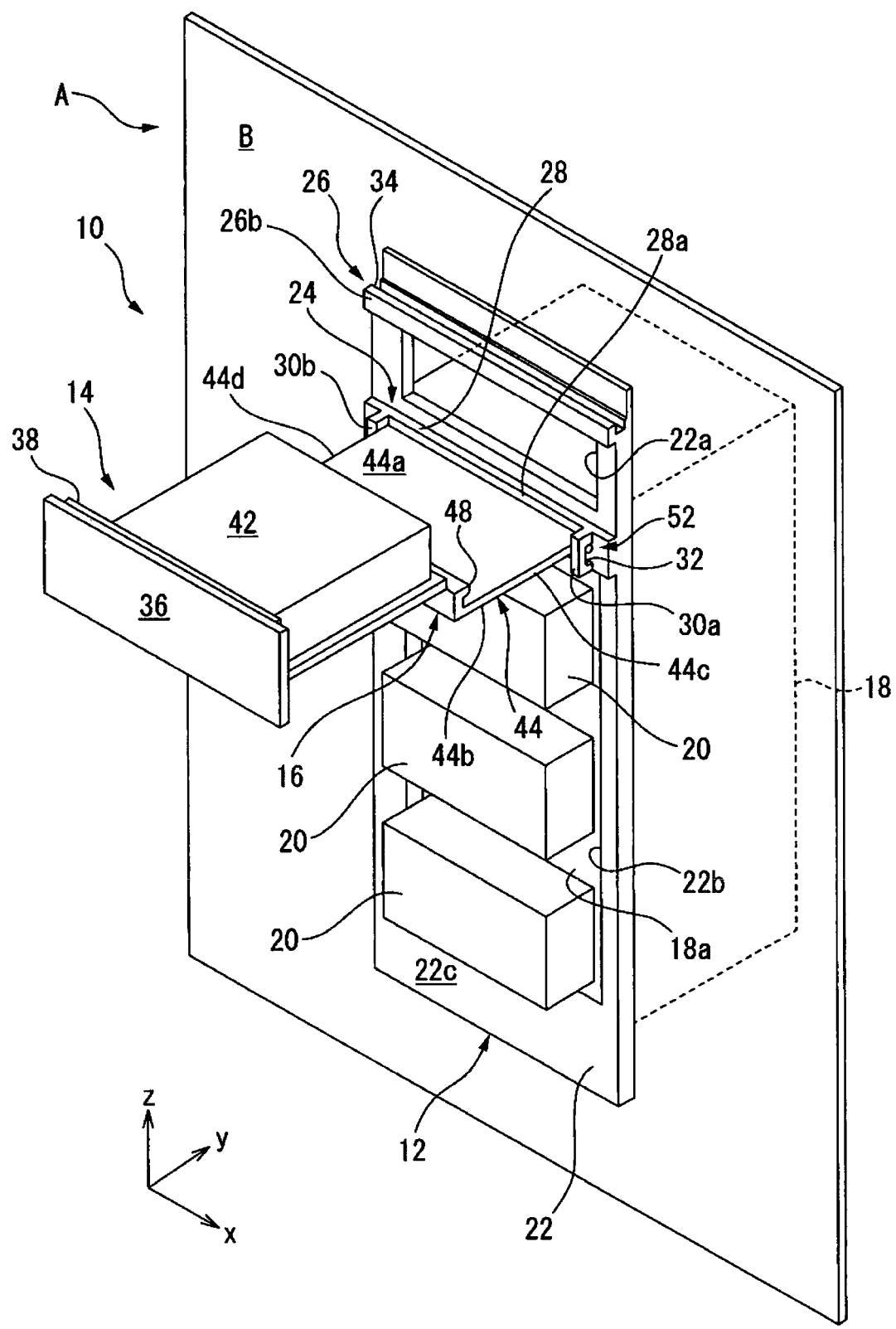
FIG. 1 is a perspective view of a motor driving device according to an embodiment.

Hereinafter, embodiments of the present disclosure will be described in detail with reference to the drawings. Note that, in the various embodiments described below, similar elements are assigned the same reference numerals, and redundant descriptions will be omitted. Further, in the following description, an orthogonal coordinate system in the drawings is used as a reference of directions, and for the sake of convenience, the x-axis plus direction is referred to as rightward direction, the y-axis plus direction is referred to as frontward direction, and the z-axis plus direction is referred to as upward direction.

A motor driving device 10 according to an embodiment is described with reference to FIGS. 1 to 3. The motor driving device 10 is housed in a hollow high-voltage cabinet A. The high-voltage cabinet A includes a partition wall B, and the motor driving device 10 is fixed to the partition wall B. In FIG. 1, only a part of the partition wall B is illustrated.

The motor driving device 10 includes a mounting member 12, a fan unit 14, a restricting member 16, a heat sink 18, and a power element 20. The mounting member 12 is fitted into an opening C (FIG. 2) formed in the partition wall B, and is fixed to the partition wall B by fasteners (not illustrated) such as bolts.

The mounting member 12 includes a base plate 22, a restricting member holding section 24, and a restricting member engaging section 26. The base plate 22 has a substantially rectangular outer shape elongated in the z-axis direction when viewed from the rear side, and is fixed to the rear side of the partition wall B.

The base plate 22 is formed with a mounting hole 22a and an opening 22b penetrating the base plate 22 in the y-axis direction. The mounting hole 22a and the opening 22b are in communication with the opening C formed in the partition wall B.

The mounting hole 22a has a substantially rectangular outer shape elongated in the x-axis direction when viewed from the rear side. The opening 22b has a substantially rectangular outer shape elongated in the z-axis direction when viewed from the rear side, and is arranged so as to be spaced downward from the mounting hole 22a.

The restricting member holding section 24 includes a base 28, and a pair of holding walls 30a and 30b. The base 28 is a flat plate member having a substantially rectangular outer shape elongated in the x-axis direction when viewed from the rear side. The base 28 is provided on the base plate 22 so as to project rearward from a rear surface 22c of the base plate 22.

A rear surface 28a of the base 28 and a rear surface 26b of the restricting member engaging section 26 are substantially parallel with the x-z plane, and are disposed at substantially the same position in the y-axis direction. In other words, the rear surface 28a of the base 28 and the rear surface 26b of the restricting member engaging section 26 are disposed on the same plane.

The holding walls 30a and 30b are provided so as to project rearward from the rear surface 28a of the base 28, and disposed separate away from each other in the x-axis direction. Each of the holding walls 30a and 30b is formed with a guide groove 32.

The guide grooves 32 are elongate holes extending in the z-axis direction, and respectively penetrating the holding walls 30a and 30b in the x-axis direction. Note that, in FIGS. 1 and 2, only one guide groove 32 formed in the holding wall 30a is illustrated.

The restricting member engaging section 26 is provided so as to project rearward from the rear surface 22c of the base plate 22, and includes a first engaging section 34. In the present embodiment, the first engaging section 34 is a recessed groove formed to be recessed downward from an upper surface 26a of the restricting member engaging section 26 and extend in the x-axis direction.

Figure 3:
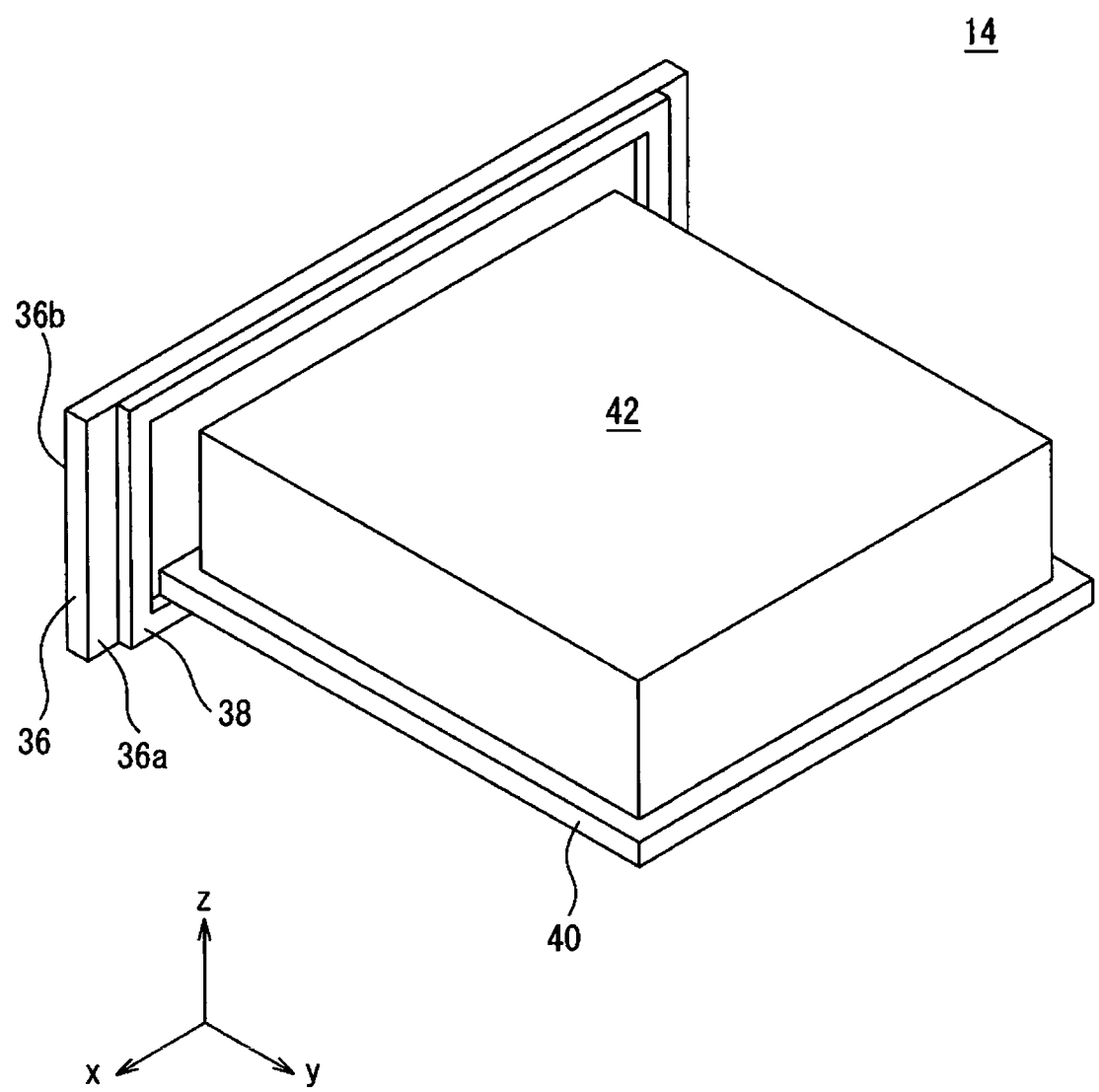
FIG. 3 is a perspective view of a fan unit illustrated in FIG. 1.

As illustrated in FIG. 3, the fan unit 14 includes a lid 36, a sealing member 38, a fan support section 40, and a fan main body 42. The lid 36 is a substantially rectangular flat plate member elongated in the x-axis direction when viewed from the y-axis direction, and includes a front surface 36a and a rear surface 36b opposite the front surface 36a.

The sealing member 38 is provided on the front surface 36a of the lid 36. The sealing member 38 is an annular member extending along the outer peripheral edge of the lid 36 so as to surround the center part of the lid 36. The sealing member 38 is made of e.g. an elastic material such as rubber.

The fan support section 40 is an annular plate member having a substantially rectangular outer shape, and its rear end is fixed to the front surface 36a of the lid 36. The fan support section 40 is formed with a vent hole (not illustrated) penetrating the fan support section 40 in the z-axis direction.

The fan main body 42 is disposed on the fan support section 40. The fan main body 42 includes a rotary body (not illustrated) having a plurality of vanes, and a motor (not illustrated) configured to rotate the rotary body. The fan main body 42 generates an air flow in the heat sink 18 through the vent hole of the fan supporting section 40. In the present embodiment, the fan main body 42 is arranged to be spaced frontward from the front surface 36a of the lid 36.

Figure 2:
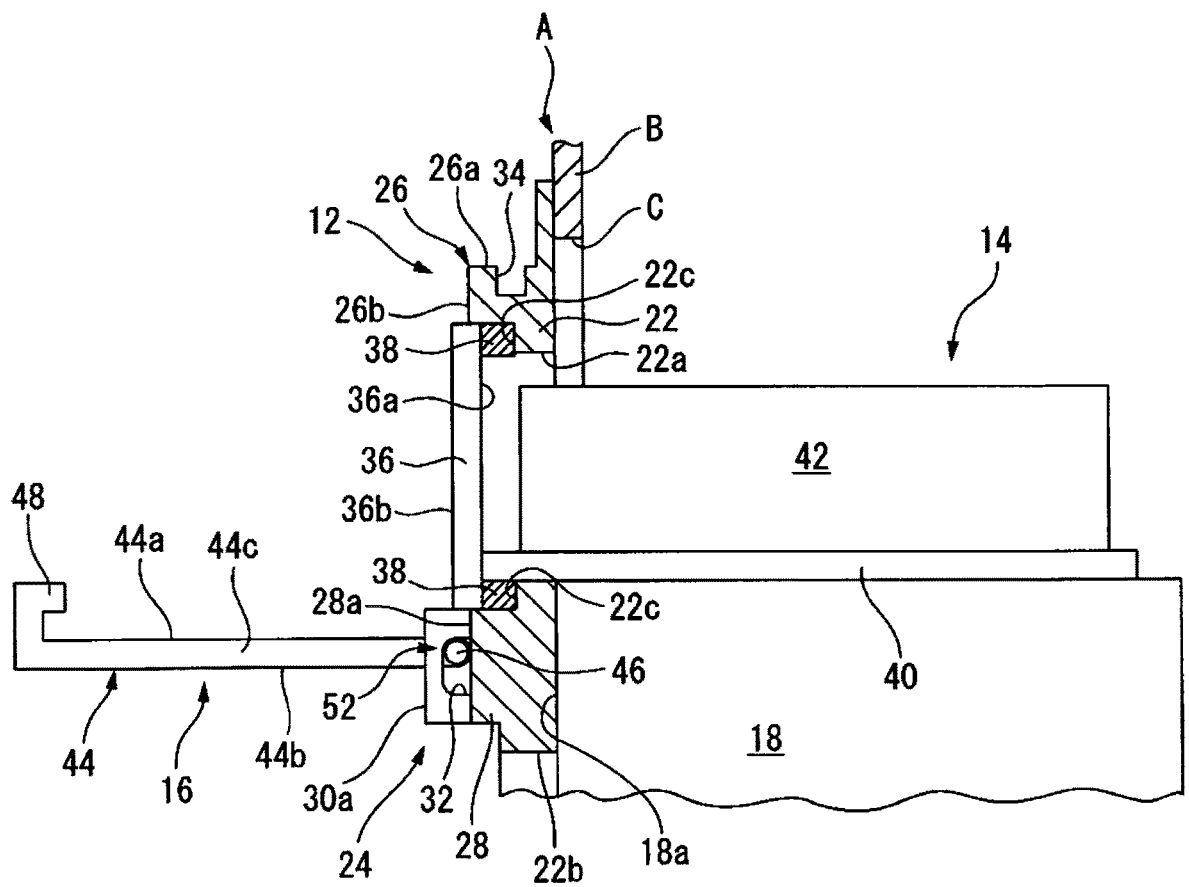
FIG. 2 is a side view of the motor driving device illustrated in FIG. 1 illustrating a cross section of members.
Figure 2:
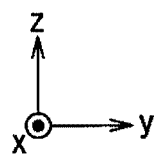

As illustrated in FIGS. 1 and 2, the restricting member 16 includes a main body 44, a pair of shafts 46 (FIG. 2), and a second engaging section 48. The main body 44 is a flat plate member having a substantially rectangular outer shape, and includes a first surface 44a, a second surface 44b opposite the first surface 44a, a right side surface 44c, and a left side surface 44d.

Each of the pair of shafts 46 has a circular-columnar shape. One of the pair of shafts 46 is provided at the main body 44 so as to project rightward from the right side surface 44c of the main body 44, and received in the guide groove 32 formed in the holding wall 30a.

The other one of the pair of shafts 46 is provided on the main body 44 so as to project leftward from the left side surface 44d of the main body 44, and received in the guide groove 32 formed in the holding wall 30b. Note that, in FIG. 2, only one of the pair of shafts 46 on the right side is illustrated.

The length of each guide groove 32 in the z-axis direction is greater than the diameter of each shaft 46. Thus, the shafts 46 can slide in the z-axis direction within the guide grooves 32. By the engagement between the shafts 46 and the guide grooves 32, the restricting member 16 is rotatably supported by the restricting member holding section 24.

The second engaging section 48 is provided so as to project from the first surface 44a of the main body 44, and extends in a substantially L-shape when viewed from the x-axis direction. The restricting member 16 may be made of a material resistant to elastic deformation, such as metal or reinforced resin.

Further, the restricting member 16 may be made of an insulating material. By making the restricting member 16 from an insulating material, the insulation distance from the power element 20 can be shortened, and therefore it is possible to improve the degree of freedom for the layout of the power element 20.

The heat sink 18 is fixed to the front side of the base plate 22 and disposed just below the fan main body 42. The power elements 20 are attached to a rear surface 18a of the heat sink 18 and exposed to the space on rear side of the partition wall B through the opening 22b of the base plate 22. Heat generated in the power elements 20 during the operation of the motor driving device 10 is conducted to the heat sink 18 and dissipated there.

Next, with reference to FIGS. 2, 4, and 5, a method of attaching and detaching the fan unit 14 to and from the mounting member 12 will be described. When attaching the fan unit 14 to the mounting member 12, an operator arranges the restricting member 16 at a position where the mounting hole 22a is opened as illustrated in FIGS. 1 and 2.

Then, as illustrated in FIG. 2, the operator inserts the fan support section 40 and the fan main body 42 into the mounting hole 22a from the rear side. At this time, the sealing member 38 provided on the front surface 36a of the lid 36 contacts the rear surface 22c of the base plate 22. In this state, the lid 36 projects rearward with respect to the rear surface 26b of the restricting member engaging section 26 and the rear surface 28a of the base 28 of the restricting member holding section 24.

Then, the operator rotates the restricting member 16 from the position illustrated in FIG. 2 in the clockwise direction when viewed from the right side. By the engagement between the shafts 46 and the guide grooves 32, the rotational movement of the restricting member 16 with respect to the mounting member 12 is guided, without the restricting member 16 dropping off from the mounting member 12.

Figure 4:
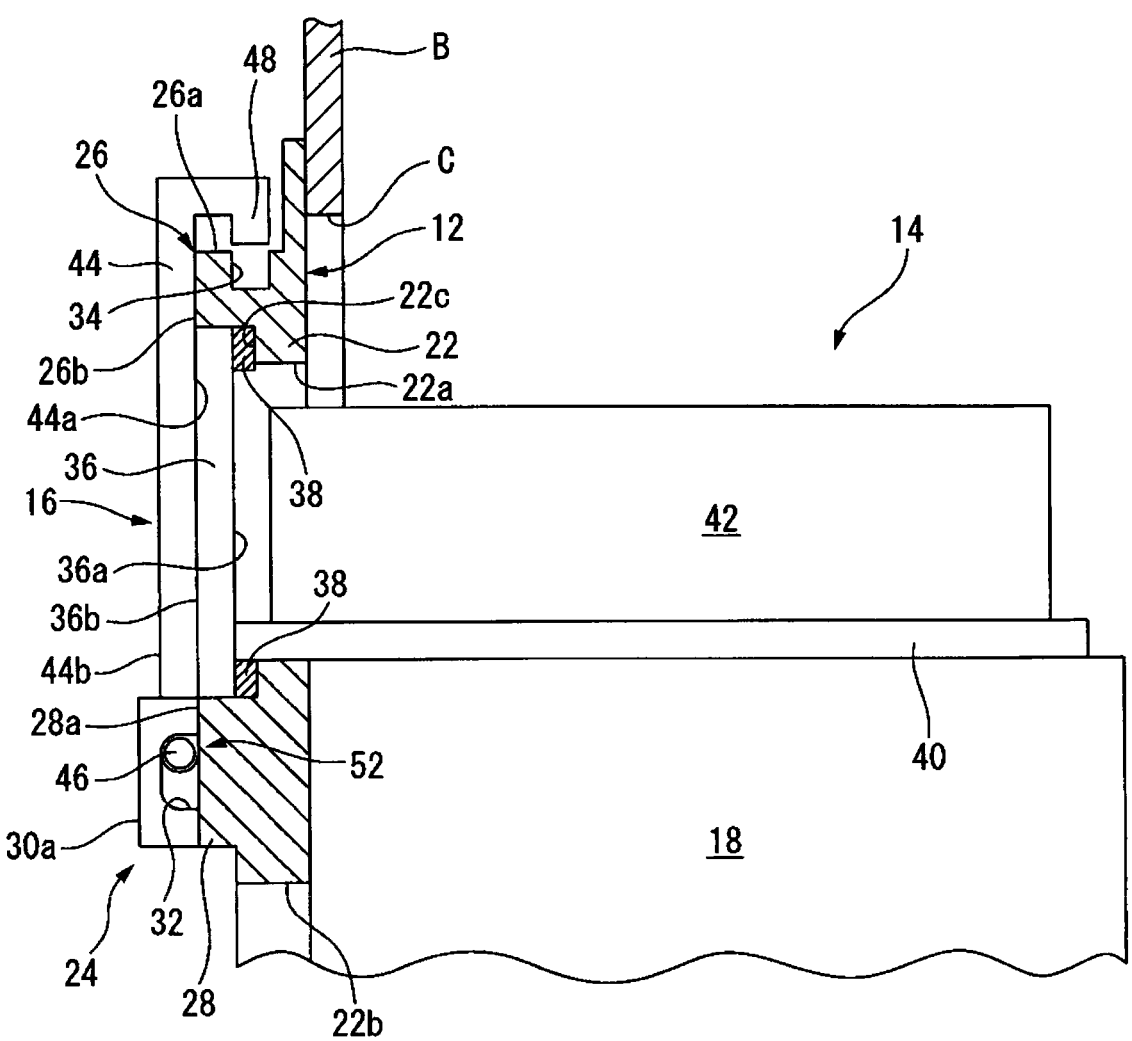
FIG. 4 is a diagram illustrating a state of a restricting member illustrated in FIG. 2 being rotated toward a lid.

As a result, as illustrated in FIG. 4, the restricting member 16 is disposed at a position where the restricting member 16 contacts the mounting member 12, and pushes the lid 36 frontward. Thereby, the lid 36 is held between the restricting member 16 and the rear surface 22c of the base plate 22 so as to face the rear surface 22c to cover the mounting hole 22a.

At this time, the first surface 44a of the main body 44 of the restricting member 16 comes into contact with the rear surface 36b of the lid 36, the rear surface 26b of the restricting member engaging section 26, and the rear surface 28a of the base 28 of the restricting member holding section 24, and presses the lid 36 frontward. Thereby, the rear surface 36b of the lid 36 is disposed substantially in the same plane as the rear surfaces 26b and 28a.

In addition, the sealing member 38 is sandwiched and compressed between the lid 36 and the rear surface 22c of the base plate 22 so as to seal a gap between the lid 36 and the base plate 22. In this manner, the mounting hole 22a is air-tightly closed by the lid 36 and the sealing member 38. On the other hand, the sealing member 38 pushes back the lid 36 to rearward as a reaction force, when compressed.

In the state illustrated in FIG. 4, the second engaging section 48 of the restricting member 16 is not fitted into the first engaging section 34 of the restricting member engaging section 26, and is spaced slightly upward of the upper surface 26a of the restricting member engaging section 26. Further, the shafts 46 are respectively disposed at the upper ends of (or nearby) the guide grooves 32.

Then, the operator moves the restricting member 16 from the position illustrated in FIG. 4 to downward along the rear surface 36b of the lid 36. Along with this movement, the shafts 46 respectively slide in the guide grooves 32 from the upper ends of the guide grooves 32 to downward, while being guided by the guide grooves 32.

Figure 5:
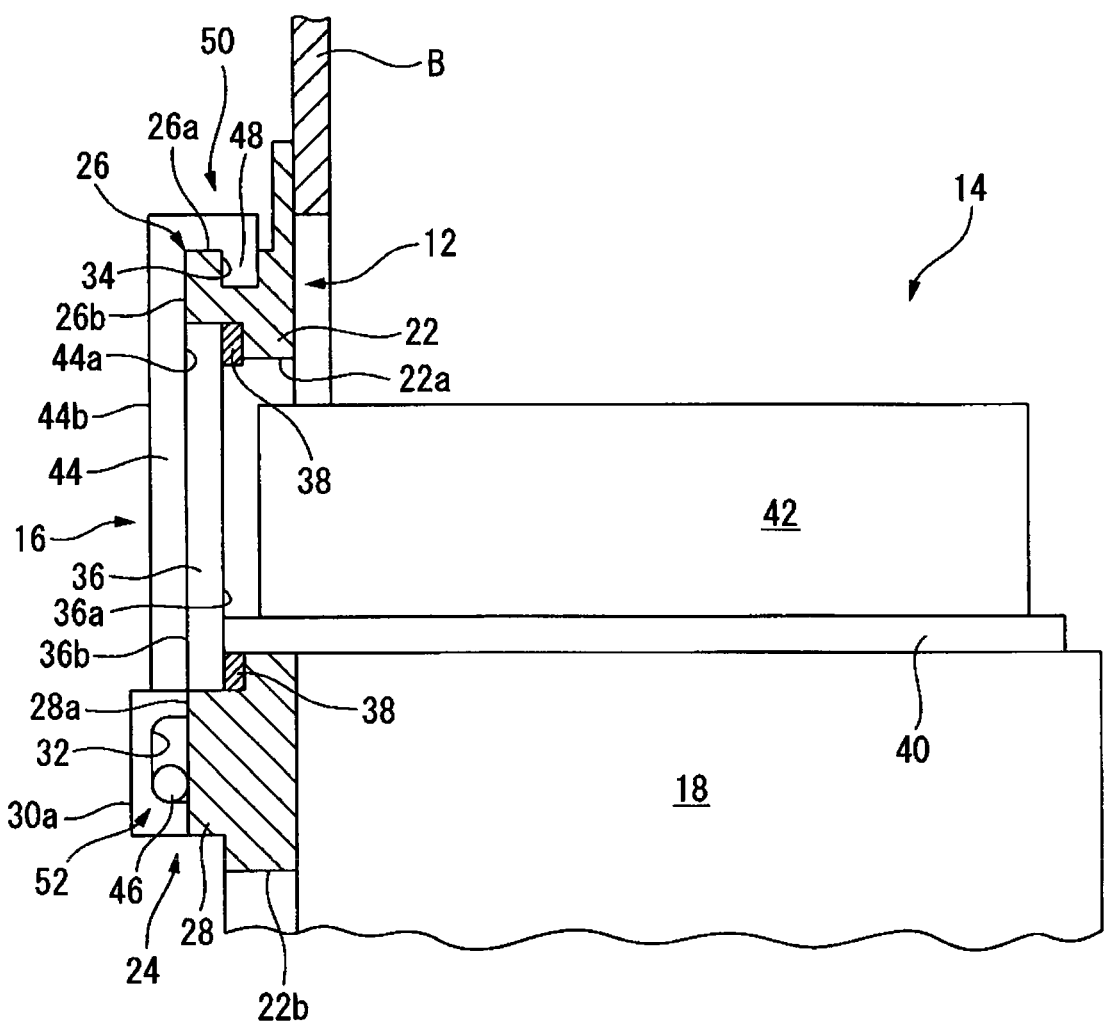
FIG. 5 is a diagram illustrating a state of the restricting member illustrated in FIG. 4 being moved to a restricting position.

As a result, the shafts 46 reach the lower ends of the guide grooves 32, and the restricting member 16 is disposed at a restricting position illustrated in FIG. 5. In this state, the second engaging section 48 of the restricting member 16 is fitted into the first engaging section 34 of the restricting member engaging section 26 so as to engage the first engaging section 34, and contacts the rear wall surface defining the first engaging section 34 in the y-axis direction (i.e., the inserting/pulling-out direction of the fan unit 14).

As a result, the rotational movement of the restricting member 16 in the counterclockwise direction when viewed from the right side is restricted, and thereby, the rearward movement (i.e., the movement in the direction away from the mounting member 12) of the lid 36 is restricted. In this way, in the present embodiment, the first engaging section 34 and the second engaging section 48 constitute a locking mechanism 50 (FIG. 5) configured to restrict the movement of the restricting member 16 in the direction away from the lid 36.

Additionally, since the sealing member 38 pushes the lid 36 rearward as a reaction force when compressed, the lid 36 is pressed against the restricting member 16. Thus, the lid 36 is firmly fixed between the restricting member 16 and the rear surface 22c of the base plate 22. In this way, in the present embodiment, the sealing member 38 functions as a force generating section configured to generate a force to push the lid 36 rearward (i.e., the direction away from the mounting member 12).

Note that, in the present disclosure, the position of the restricting member 16 where the rearward movement of the lid 36 is allowed is referred to as a non-restricting position. For example, in FIGS. 2 and 4, the first engaging section 34 and the second engaging section 48 do not engage with each other, and thereby the lid 36 (i.e., the fan unit 14) is movable to rearward.

Accordingly, the positions of the restricting member 16 illustrated in FIGS. 2 and 4 each correspond to the non-restricting position. In other words, the non-restricting position in the present embodiment corresponds to the position of the restricting member 16 where the first engaging section 34 and the second engaging section 48 do not engage with each other.

As described above, in the present embodiment, by the shafts 46 and the guide grooves 32 that receive the shafts 46 so as to be slidable in the z-axis direction, the movement of the restricting member 16 along the lid 36 from the position illustrated in FIG. 4 (i.e., the non-restricting position) to the restricting position illustrated in FIG. 5. Thus, the shafts 46 and the guide grooves 32 constitute a guide mechanism 52 configured to guide the movement of the restricting member 16 along the lid 36 from the non-restricting position to the restricting position.

When removing the fan unit 14 from the mounting member 12, the operator moves the restricting member 16 upward along the rear surface 36b of the lid 36 from the restricting position illustrated in FIG. 5 to the position illustrated in FIG. 4 (i.e., the non-restricting position) so as to disengage the second engaging section 48 from the first engaging section 34.

Then, the operator rotates the restricting member 16 in the counterclockwise direction when viewed from the right side, and moves it away from the lid 36 as illustrated in FIG. 2. Then, the operator pulls out the fan unit 14 rearward.

As described above, according to the present embodiment, the lid 36 can be fixed to the mounting member 12 by the restricting member 16 without using fasteners such as bolts, and therefore it is possible to simplify the work of attaching/detaching the fan unit 14 to/from the mounting member 12.

Additionally, in the present embodiment, the guide mechanism 52 guides the movement of the restricting member 16 to rotate from the position illustrated in FIG. 2 to the position illustrated in FIG. 3, and then move from the position illustrated in FIG. 3 to downward along the lid 36 so as to be disposed at the restricting position illustrated in FIG. 4.

According to this configuration, the restricting member 16 can be disposed at the restricting position without being elastically deformed, which makes it unnecessary to produce the restricting member 16 from an elastic member, and by which it is possible to extend the service life of the restricting member 16.

These effects will be described below. If the guide mechanism 52 (i.e., the guide grooves 32) that guides the movement of the restricting member 16 in the z-axis direction is not provided and the restricting member 16 is rotated to be engaged with the mounting member 12, the second engaging section 48 is necessarily elastically deformed when being fitted into the first engaging section 34 (i.e., snap fitted).

In this case, it is necessary to make the restricting member 16 from a material that can be elastically deformed. In addition, it is also necessary to apply a force to the restricting member 16 in order to fit the second engaging section 48 into the first engaging section 34. Furthermore, by repeatedly attaching and detaching the second engaging section 48 to and from the first engaging section 34, the second engaging section 48 is repeatedly elastically deformed, which may cause fatigue in the restricting member 16.

According to the present embodiment, by the guide mechanism 52, the restricting member 16 can be moved downward after being rotated so as to be disposed at the restricting position, due to which it is possible to dispose the restricting member 16 at the restricting position without being elastically deformed. Accordingly, it is unnecessary to make the restricting member 16 from an elastic member, and therefore the restricting member 16 can be made from a material of high rigidity (high hardness) which is resistant to elastic deformation.

If the restricting member 16 is made from a material of high rigidity in this way, since the restricting member 16 can press the lid 36 without being deformed when it is disposed at the restricting position, the restricting member 16 can press the lid 36 with a uniform pressure. As a result, strain in the sealing member 38 can be prevented, and therefore it is possible to improve the seal of the mounting hole 22a.

Additionally, the operator can easily fit the second engaging section 48 into the first engaging section 34 without applying a force to the restricting member 16. Furthermore, since fatigue due to elastic deformation is prevented in the restricting member 16, it is possible to extend the service life of the restricting member 16.

Also, the movement of the restricting member 16 to and from the restricting position is guided by the guide mechanism 52, the repeatability of the movement of the restricting member 16 to and from the restricting position can be improved. Thus, the restricting member 16 can be correctly disposed at and removed from the restricting position even when different operators carry out moving the restricting member 16 to and from the restricting position.

By the guide mechanism 52, the restricting member 16 is rotated from the position illustrated in FIG. 2 to the position illustrated in FIG. 4 so as to press the lid 36 against the mounting member 12, and then, moved downward along the lid 36 to the restricting position. According to this configuration, the pressure from the restricting member 16 against the lid 36 can be more uniform, thereby it is possible to more effectively prevent the generation of the strain in the sealing member 38.

In the present embodiment, the guide mechanism 52 is comprised of the shaft 46 and the guide groove 32. According to this configuration, the movement of the restricting member 16 can be guided to smoothly rotate and move in the direction along the lid 36 (i.e., the z-axis direction).

Thus, the operator can smoothly carry out moving the restricting member 16 from the non-restricting position to the restricting position (or vice versa). Also, the structure of the guide mechanism 52 can be simplified.

In the present embodiment, the motor driving device 10 includes the locking mechanism 50 that restricts the movement of the restricting member 16 in the direction away from the lid 36 when the restricting member 16 is moved to the restricting position. According to this configuration, the lid 36 (i.e., the fan unit 14) can be firmly fixed to the mounting member 12 by the restricting member 16.

In the present embodiment, the locking mechanism 50 is comprised of the second engaging section 48 and the first engaging section 34. According to this configuration, the locking mechanism 50 that bring about the above-mentioned function can be implemented by a simpler structure.

Next, with reference to FIGS. 6 to 9, a motor driving device 70 according to another embodiment will be described. Note that, in FIG. 6, the fan unit 14 is not illustrated for the sake of easy understanding. The motor driving device 70 differs from the above-described motor driving device 10 in a mounting member 72 and a restricting member 73.

The mounting member 72 includes the base plate 22 and a pair of restricting member holding sections 74 and 76. The restricting member holding section 74 is disposed adjacent to the right side of the mounting hole 22a, and is provided at the base plate 22 so as to project rearward from the rear surface 22c of the base plate 22.

Figure 7:
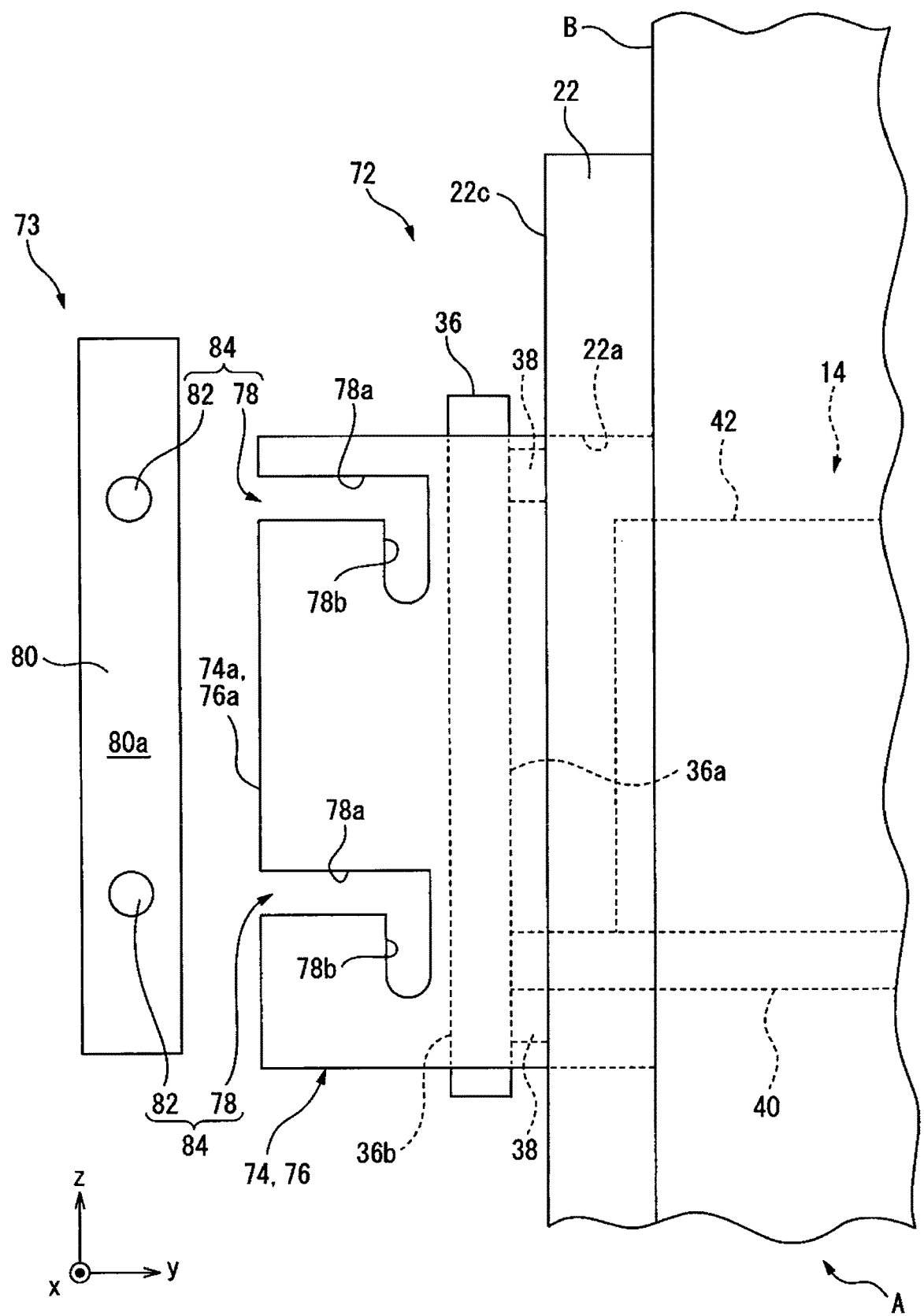
FIG. 7 is a side view of the motor driving device illustrated in FIG. 6.

The restricting member holding section 74 is formed with a total of two guide grooves 78 spaced from each other in the z-axis direction. As illustrated in FIG. 7, each of the guide grooves 78 includes a first groove section 78a extending in the y-axis direction and a second groove section 78b connected to the first groove section 78a and extending in the z-axis direction.

The first groove section 78a opens, at its rear end, to the outside on a rear surface 74a of the restricting member holding section 74, and extends frontward from the rear surface 74a. The second groove section 78b extends downward from the front end of the first groove section 78a.

The restricting member holding section 76 is disposed adjacent to the left side of the mounting hole 22a so as to space away from the restricting member holding section 74 to leftward. Similar as the restricting member holding section 74, the restricting member holding section 76 is formed with the two guide grooves 78.

The upper guide groove 78 formed in the restricting member holding section 74 and the upper guide groove 78 formed in the restricting member holding section 76 are disposed at the same position in the z-axis direction. Further, the lower guide groove 78 formed in the restricting member holding section 74 and the lower guide groove 78 formed in the restricting member holding section 76 are disposed at the same position in the z-axis direction.

The restricting member 73 includes a main body 80 and a total of four circular-columnar shafts 82. The main body 80 is a flat plate member having a substantially rectangular shape elongated in the x-axis direction when viewed from the rear side. Two shafts 82 are provided on a right side surface 80a of the main body 80 so as to project rightward from the right side surface 80a. Two shafts 82 are provided on a left side surface 80b of the main body 80 so as to project leftward from the left side surface 80b.

The upper shaft 82 provided on the right side surface 80a and the upper shaft 82 provided on the left side surface 80b are disposed to be concentric with each other. Further, the lower shaft 82 provided on the right side surface 80a and the lower shaft 82 provided on the left side surface 80b are disposed to be concentric with each other.

Figure 6:
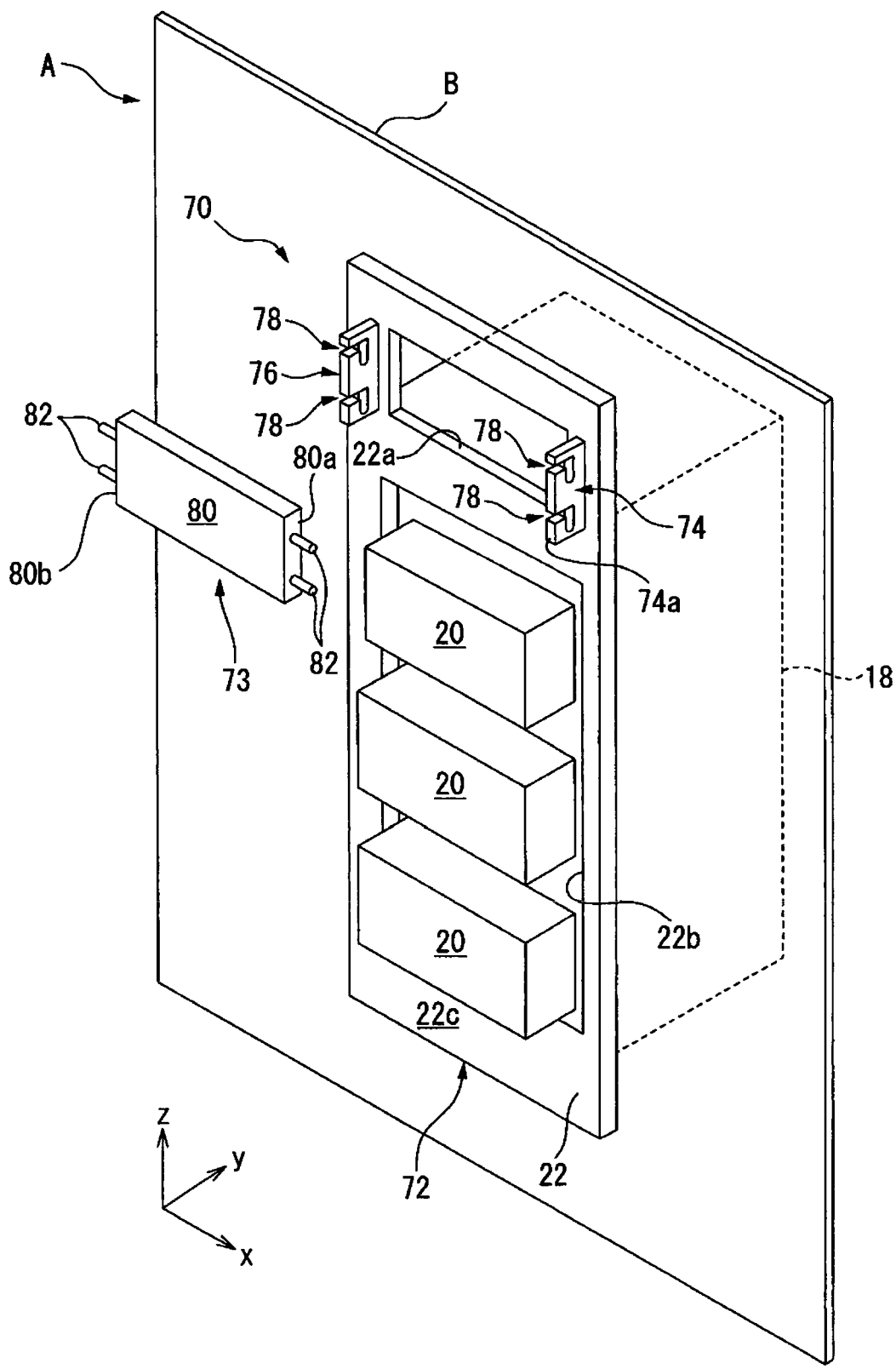
FIG. 6 is a perspective view of a motor driving device according to another embodiment.

When attaching the fan unit 14 to the mounting member 72 in the motor driving device 70, the operator disposed the fan unit 14 between the restricting member holding sections 74 and 76 while the restricting member 73 is removed from the mounting member 72 as illustrated in FIG. 6.

Then, the operator inserts the fan support section 40 and the fan main body 42 from the rear side into the mounting hole 22a. As a result, as illustrated in FIG. 7, the sealing member 38 provided on the front surface 36a of the lid 36 contacts the rear surface 22c of the base plate 22, and the lid 36 is disposed between the restricting member holding sections 74 and 76.

Then, the operator inserts the shafts 82 provided on the right side surface 80a of the restricting member 73 into the first groove sections 78a of the guide grooves 78 formed in the restricting member holding section 74, and inserts the shafts 82 provided on the left side surface 80b of the restricting member 73 into the first groove sections 78a of the guide grooves 78 formed in the restricting member holding section 76.

Figure 8:
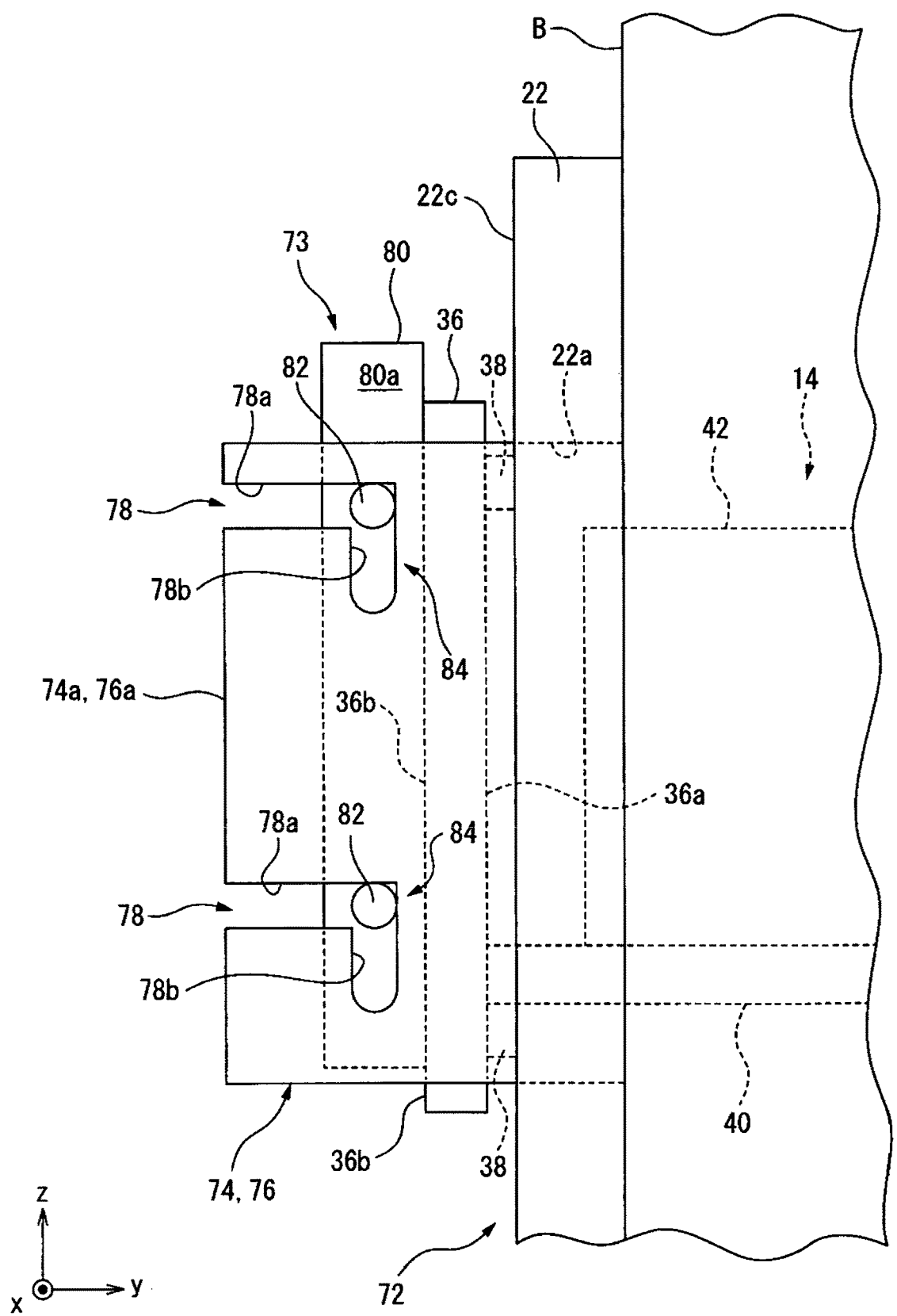
FIG. 8 is a diagram illustrating a state of a restricting member illustrated in FIG. 7 being moved toward a lid.

Then, as illustrated in FIG. 8, the operator moves the restricting member 73 frontward so as to approach the lid 36. Along with this movement, each shaft 82 slides frontward in the corresponding first groove section 78a, and reaches the front end of the corresponding first groove section 78a (i.e., the upper end of the second groove section 78b).

At this time, the main body 80 of the restricting member 73 presses the rear surface 36b of the lid 36, thereby, the sealing member 38 is sandwiched and compressed between the lid 36 and the rear surface 22c of the base plate 22 so as to seal a gap between the lid 36 and the base plate 22. In this manner, the mounting hole 22a is air-tightly closed by the lid 36 and the sealing member 38.

In the state illustrated in FIG. 8, the movement of the restricting member 73 in the direction away from the lid 36 (i.e., rearward direction) is allowed. Accordingly, the position of the restricting member 73 illustrated in FIG. 8 corresponds to the non-restricting position.

Then, the operator moves the restricting member 73 from the position illustrated in FIG. 8 to downward along the rear surface 36b of the lid 36. Along with this, each shaft 82 slides in the corresponding second groove section 78b to downward from the upper end of the corresponding second groove section 78b, while being guided by the second groove section 78b. As a result, the restricting member 73 is disposed at the restricting position illustrated in FIG. 9.

In this state, each shaft 82 reaches the lower end of the corresponding second groove section 78b, and engages in the y-axis direction with the rear wall surface defining the second groove section 78b, as a result of which, the rearward movement of each shaft 82 is restricted.

By the engagement structure between the shafts 82 and the rear wall surfaces of the second groove sections 78b, the movement of the restricting member 73 in the direction away from the lid 36 (i.e., rearward direction) is restricted. Thus, in the present embodiment, the engagement structure between the shafts 82 and the rear wall surfaces of the second groove section 78b constitutes a locking mechanism configured to restrict the movement of the restricting member 73 in the direction away from the lid 36.

Figure 9:
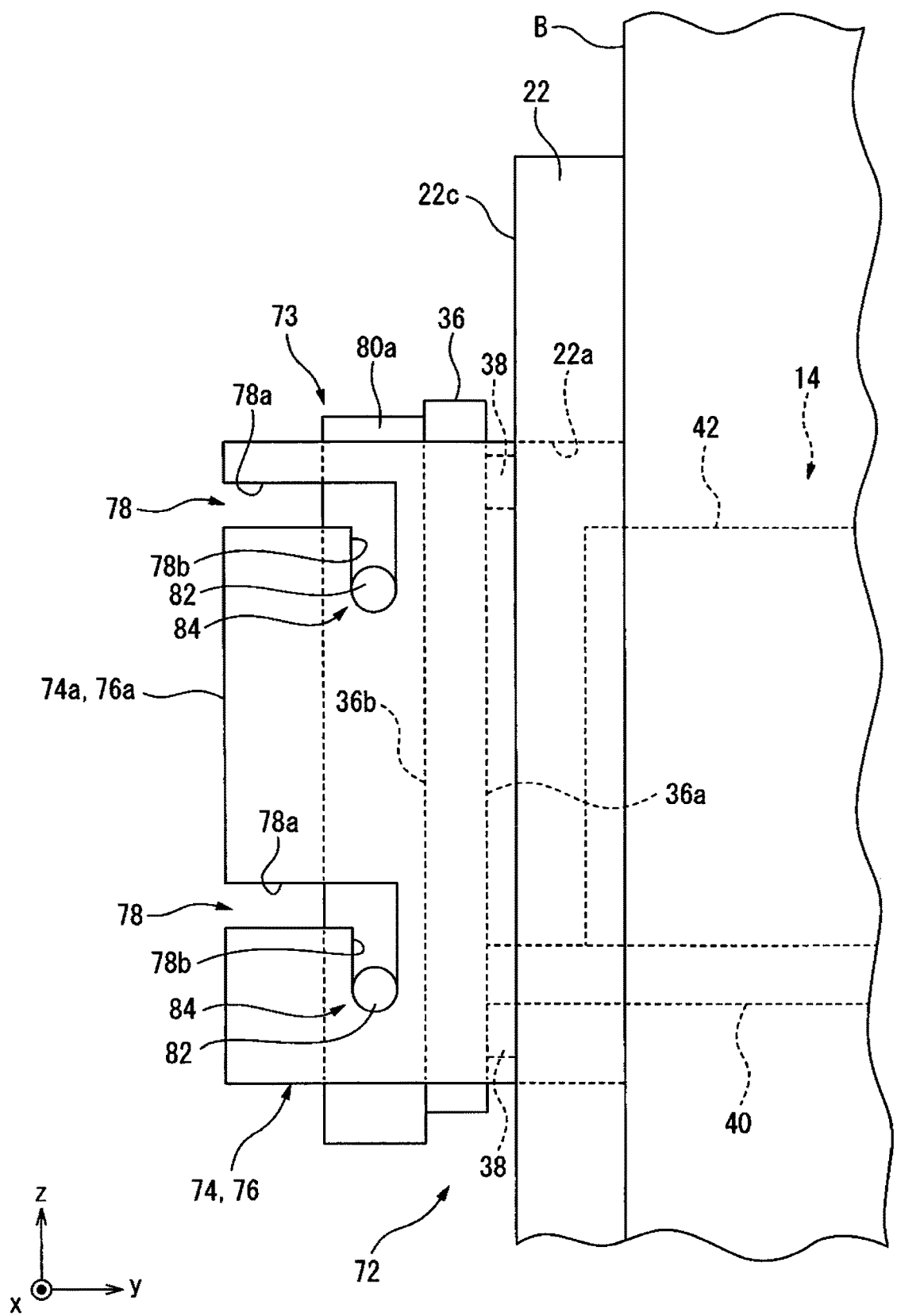
FIG. 9 is a diagram illustrating a state of the restricting member illustrated in FIG. 8 being moved to a restricting position.

As described above, in the present embodiment, the shafts 82 and the guide grooves 78 guide the movement of the restricting member 73 from the position illustrated in FIG. 7 (the non-restricting position) to the position illustrated in FIG. 8 (non-restricting position), then from the position illustrated in FIG. 8 to the restricting position illustrated in FIG. 9 along the lid 36. Thus, the shafts 82 and the guide grooves 78 constitute a guide mechanism 84 configured to guide the movement of the restricting member 73 along the lid 36 from the non-restricting position to the restricting position.

When detaching the fan unit 14 from the mounting member 72, the operator moves the restricting member 73 upward along the rear surface 36b of the lid 36 from the restricting position illustrated in FIG. 9 to the position illustrated in FIG. 8 (the non-restricting position).

Then, the operator moves the restricting member 73 rearward so as to separate away from the lid 36. As a result, as illustrated in FIG. 6, the restricting member 73 is removed from the mounting member 72, thereby the fan unit 14 can be pulled out from the mounting hole 22a.

According to the present embodiment, similar as the embodiment described above, the restricting member 73 can be disposed in the restricting position without being elastically deformed, and therefore, the restricting member 73 can be made from a material resistant to elastic deformation. Further, the restricting member 73 is moved from the position illustrated in FIG. 7 to the position illustrated in FIG. 8 so as to press the lid 36 against the base plate 22, and then moved downward to the restricting position. Due to this operation, the pressure applied from the restricting member 73 to the lid 36 can be made uniform.

Furthermore, in the present embodiment, by the first groove sections 78a and the second groove sections 78b, the operator can smoothly and easily dispose the restricting member 73 at the restricting position, only by a series of the operations to move the restricting member 73 frontward then downward.

Note that, there are various variations of the guide groove 78. Below, variations of the guide groove 78 are described with reference to FIGS. 10 and 11. Note that, in FIGS. 10 and 11, the fan unit 14 is not illustrated for the sake of easy understanding.

Figure 10:
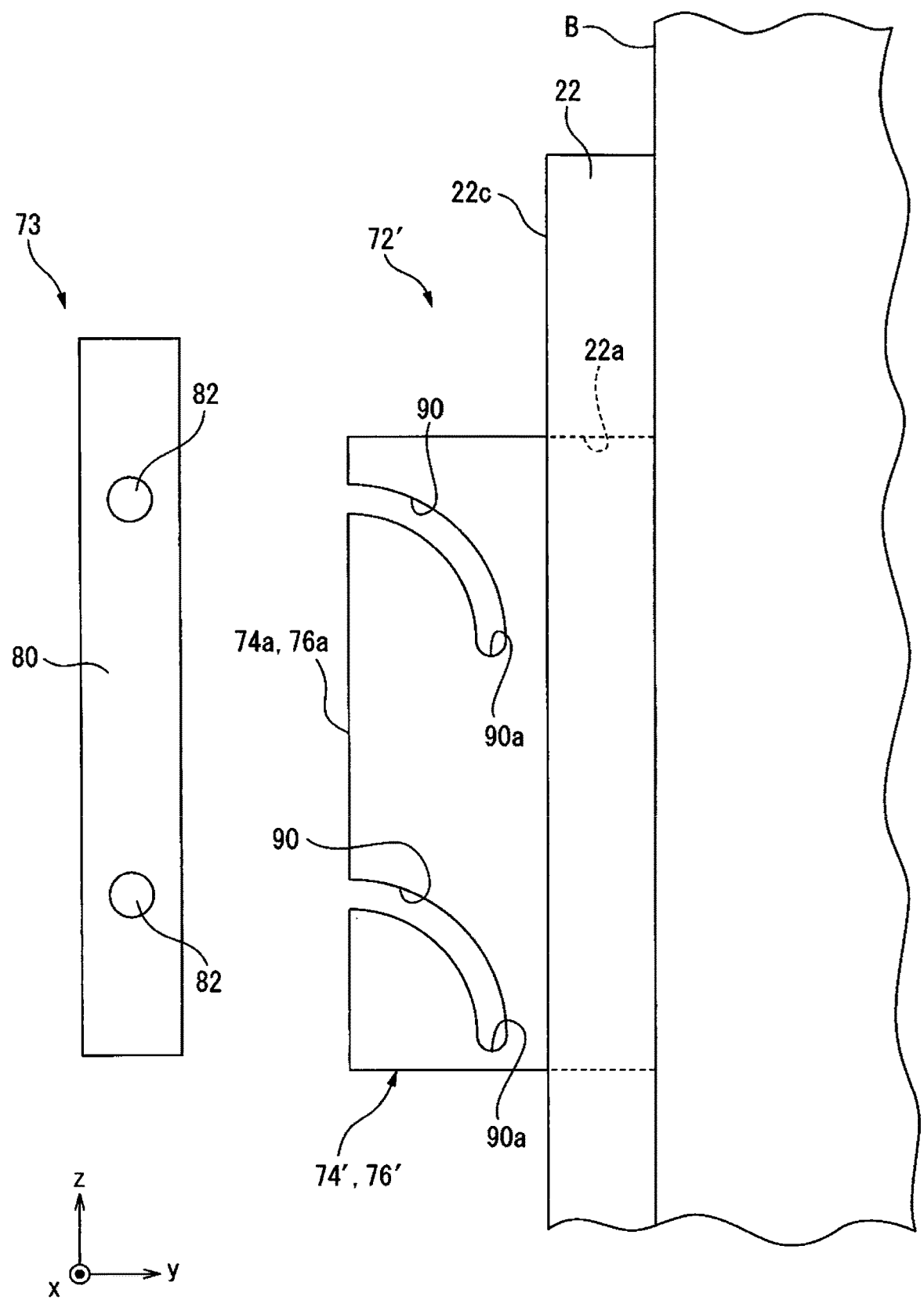
FIG. 10 is a diagram illustrating a guide groove according to another embodiment.

In a mounting member 72' illustrated in FIG. 10, guide grooves 90 are provided at restricting member holding sections 74' and 76' so as to extend along arc paths. Specifically, each of the restricting member holding sections 74' and 76' is formed with a total of the two guide grooves 90 spaced from each another in the z-axis direction.

Each guide groove 90 opens, at its rear end, to the outside on the rear surfaces 74a and 76a of the restricting member holding sections 74' and 76', and is provided so as to curvedly extend downward along an arc path as it extends frontward from the rear surfaces 74a and 76a. These guide grooves 90 have substantially the same radius of curvature. Note that, the guide grooves 90 are not limited to an arc shape, but may extend along any curved path.

When attaching the restricting member 73 to the mounting member 72' in the embodiment illustrated in FIG. 10, the operator inserts the fan support section 40 and the fan main body 42 (not illustrated) into the mounting hole 22a from the rear side, and disposes the lid 36 (not illustrated) between the restricting member holding sections 74' and 76'.

Then, the operator inserts the shafts 82 of the restricting member 73 in the corresponding guide grooves 90, respectively, and moves the restricting member 73 frontward. Then, the shafts 82 slide in the guide grooves 90 while being guided by the guide grooves 90. As a result, the restricting member 73 is moved along the guide grooves 90 so as to approach the lid 36 along with moving downward along the lid 36 (not illustrated), and reaches lower ends 90a of the guide grooves 90.

When the shafts 82 reach the lower ends 90a of the guide grooves 90, the shafts 82 engage in the y-axis direction with the rear wall surfaces defining the guide grooves 90. As a result, the restricting member 73 is restricted from moving rearward away from the lid 36. Thus, in the present embodiment, the engagement structure between the shafts 82 and the rear wall surfaces of the guide grooves 90 constitutes a locking mechanism configured to restrict the rearward movement of the restricting member 73.

Figure 11:
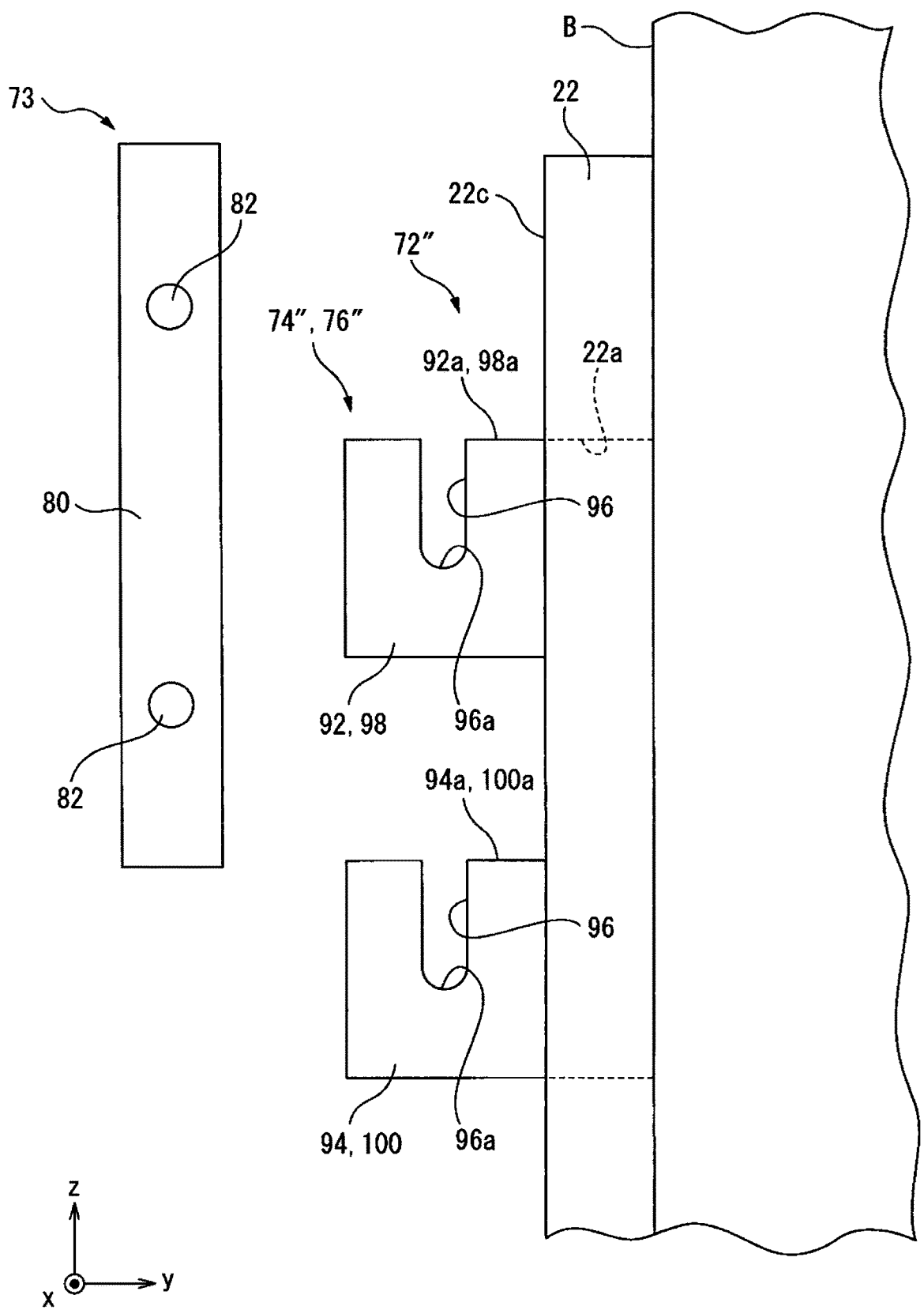
FIG. 11 is a diagram illustrating a guide groove according to yet another embodiment.

A mounting member 72" illustrated in FIG. 11 includes a restricting member holding section 74" disposed adjacent to the right side of the mounting hole 22a and a restricting member holding section 76" disposed adjacent to the left side of the mounting hole 22a.

The restricting member holding section 74" includes a first section 92 and a second section 94 spaced from each other in the z-axis direction. The first section 92 is formed with a guide groove 96 extending downward from an upper surface 92a of the first section 92. The second section 94 is formed with a guide groove 96 extending downward from an upper surface 94a of the second section 94.

Similarly, the restricting member holding section 76" includes a first section 98 and a second section 100 spaced from each other in the z-axis direction. The first section 98 is formed with a guide groove 96 extending downward from an upper surface 98a of the first section 98. The second section 100 is formed with a guide groove 96 extending downward from an upper surface 100a of the second section 100. In this way, a total of four guide grooves 96 are formed in the mounting member 72" extending in the z-axis direction.

When attaching the restricting member 73 to the mounting member 72", the operator inserts the fan support section 40 and the fan main body 42 (not illustrated) into the mounting hole 22a from the rear side, and disposes the lid 36 (not illustrated) between the restricting member holding sections 74" and 76".

Then, the operator fits the shafts 82 of the restricting member 73 into the respective guide grooves 96 from upside. At this time, the restricting member 73 presses the lid 36 frontward as illustrated in FIG. 8, and thereby, the sealing member 38 is sandwiched and compressed between the restricting member 73 and the base plate 22.

Then, the operator moves the restricting member 73 downward along the lid 36 (not illustrated). Along with this operation, each shaft 82 slides downward in the corresponding guide groove 96 while guided by the guide groove 96, and reaches a lower end 96a of the guide groove 96.

When the shafts 82 reach the lower ends 96a of the respective guide grooves 96, the shafts 82 engage in the y-axis direction with the rear wall surfaces defining the guide grooves 96. As a result, the restricting member 73 is restricted from moving rearward away from the lid 36. Thus, in the present embodiment, the engagement structure between the shafts 82 and the rear wall surfaces of the guide grooves 96 constitutes a locking mechanism configured to restrict the rearward movement of the restricting member 73.

According to the embodiments illustrated in FIGS. 10 and 11, since the restricting member 73 can be disposed at the restricting position without being elastically deformed, the restricting member 73 can be made from a material resistant to elastic deformation, similarly as the above-mentioned embodiments. Additionally, the operator can smoothly and easily dispose the restricting member 73 at the restricting position, and also the pressure applied from the restricting member 73 to the lid 36 can be made uniform.

Note that, the restricting member 73 may be made of an insulating material. Additionally, the lid 36 may be configured to cover a part of the mounting hole 22a. Furthermore, there are various variations of the guide mechanism (52, 84) described above. For example, the guide mechanism may include a rail and a wheel that engages the rail so as to roll on the rail.

Figure 12:
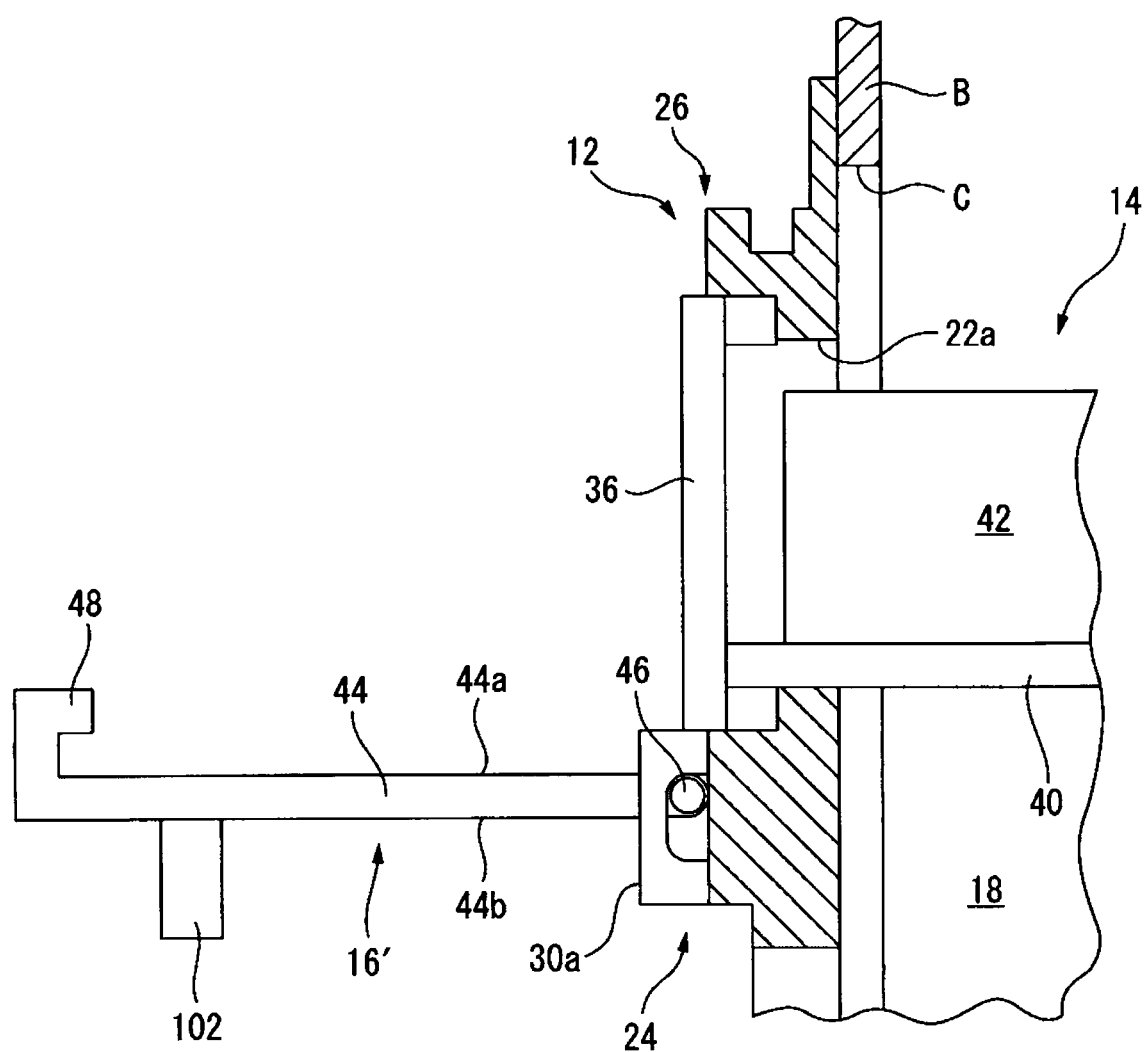
FIG. 12 is a diagram illustrating a restricting member according to another embodiment.

Additionally, the restricting member 16 or 73 may further include a handle provided on the side opposite the lid 36. Such an embodiment will be described with reference to FIG. 12. A restricting member 16' illustrated in FIG. 12 includes the main body 44, the pair of shafts 46, the second engaging section 48, and a handle 102.

The handle 102 is provided so as to project outward from the second surface 44b of the main body 44. Note that, the handle 102 may be provided as a recess recessed inward from the second surface 44b of the main body 44.

By providing such a handle 102, the operator can easily move the restricting member 16' by holding the handle 102. Note that, the handle 102 may be formed on the surface of the main body 80 of the restricting member 73 on the side opposite the lid 36.

While the present disclosure has been described through the embodiments, the above-described embodiments do not limit the invention as defined by the appended claims.

As stated above, in an aspect of the present disclosure, the guide mechanism includes a shaft provided at one of the restricting member and the mounting member; and a guide groove provided at the other of the restricting member and the mounting member, and receiving the shaft so as to allow the movement of the restricting member along the lid together with rotation of the restricting member relative to the mounting member. The guide groove includes a first groove section formed to allow movement of the restricting member toward and away from the lid; and a second groove section connected to the first groove section and formed to allow the movement of the restricting member along the lid. The motor driving device comprises a locking mechanism configured to restrict movement of the restricting member in a direction away from the lid when the restricting member is moved to the restricting position. The locking mechanism includes a first engaging section provided at one of the restricting member and the mounting member; and a second engaging section provided at the other of the restricting member and the mounting member, and releasably engaging the first engaging section. The restricting member further includes a handle provided on a side opposite the lid.

The invention claimed is:

1. A motor driving device comprising:
 a mounting member formed with a mounting hole;
 a fan unit fixed to the mounting member, and including:
  a lid disposed so as to cover at least a part of the mounting hole, and having a first surface facing the mounting member and a second surface opposite the first surface; and
  a sealing member provided on the first surface;
 a restricting member configured to restrict movement of the lid in a direction away from the mounting member by holding the lid between the restricting member and the mounting member; and
 a guide mechanism configured to guide movement of the restricting member relative to the lid between a non-restricting position where the movement of the lid in the direction is allowed and a restricting position where the movement of the lid in the direction is restricted,
 wherein the mounting member includes:
  a first surface extending around the mounting hole and facing in the direction; and
  a second surface facing in the direction and disposed so as to be separate from the first surface of the mounting member,
 wherein, when the restricting member is disposed in the restricting position, the sealing member contacts the first surface of the mounting member such that the mounting hole is closed by both the sealing member and the lid, and the restricting member contacts the second surface of the lid and the second surface of the mounting member.

2. The motor driving device of claim 1, wherein the guide mechanism includes:
 a shaft provided on one of the restricting member and the mounting member; and
 a guide groove provided in the other one of the restricting member and the mounting member, and receiving the shaft so as to allow the movement of the restricting member relative to the lid.

3. The motor driving device of claim 1, further comprising a locking mechanism configured to restrict movement of the restricting member when the restricting member is moved to the restricting position.

4. The motor driving device of claim 3, wherein the locking mechanism includes:
 a first engaging section provided on one of the restricting member and the mounting member; and
 a second engaging section provided on the other one of the restricting member and the mounting member.

5. The motor driving device of claim 1, wherein the restricting member further includes a handle.

* * * * *